(12) United States Patent
Suzuki et al.

(10) Patent No.: US 8,084,935 B2
(45) Date of Patent: Dec. 27, 2011

(54) ORGANIC ELECTROLUMINESCENT ELEMENT AND DISPLAY PANEL USING SAID ELEMENT

(75) Inventors: Satoshi Suzuki, Tokyo-To (JP); Masato Okada, Tokyo-To (JP); Yoshinobu Kashibuchi, Hiratsuka (JP); Tohru Kobayashi, Hiratsuka (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 1310 days.

(21) Appl. No.: 10/984,355

(22) Filed: Nov. 9, 2004

(65) Prior Publication Data
US 2005/0129980 A1    Jun. 16, 2005

(30) Foreign Application Priority Data
Nov. 11, 2003    (JP) ................. 2003-381737

(51) Int. Cl.
*C09K 11/06* (2006.01)
*H01L 51/50* (2006.01)
(52) U.S. Cl. ........ 313/504; 313/506; 428/690; 428/917; 257/40; 257/E51.033; 257/E51.036
(58) Field of Classification Search ............... None
See application file for complete search history.

(56) References Cited

U.S. PATENT DOCUMENTS
2002/0041979 A1* 4/2002 Taguchi ............... 428/690
2003/0091862 A1* 5/2003 Tokito et al. .......... 428/690

FOREIGN PATENT DOCUMENTS

| EP | 0 850 960 A1 | 7/1998 |
|----|---|---|
| JP | 07-286170 | 10/1995 |
| JP | 11-241062 | 9/1999 |
| JP | 2002-124389 | 4/2002 |
| JP | 2002-302516 | 10/2002 |
| JP | 2003-178884 | * 6/2003 |
| WO | WO 03/074628 | * 9/2003 |
| WO | WO 03/076548 | * 9/2003 |

OTHER PUBLICATIONS

Sasakawa et al., Macromolecules, (1989), vol. 22, No. 11, pp. 4253-4259.*
Machine Assisted Translation, JP 2003-178884, Mashimo et al.*
Machine Assisted Translation, JP (2003)-178884, Mashita et al., (2003).*
Masuhara et al., "Laser Photochemistry of Polymers Having 1,2-trans Dicarbazolylcyclobutane Groups in Solution", Macromolecules, 1981, 14, pp. 1738-1742.

* cited by examiner

*Primary Examiner* — Jennifer Chriss
*Assistant Examiner* — Brett A Crouse
(74) *Attorney, Agent, or Firm* — Burr & Brown

(57) ABSTRACT

There are provided an organic electroluminescent (EL) element, which can realize the provision of a large screen by the formation of a film through coating in a simple and highly efficient manner, and a display panel using the same. The organic EL element comprises: a pair of opposed electrodes, a cathode and an anode; and an organic compound layer having a single-layer or multi-layer structure held between the pair of opposed electrodes, at least one layer constituting the organic compound layer being a layer containing at least one polymer comprising at least one monomer unit of a specific compound.

7 Claims, 3 Drawing Sheets

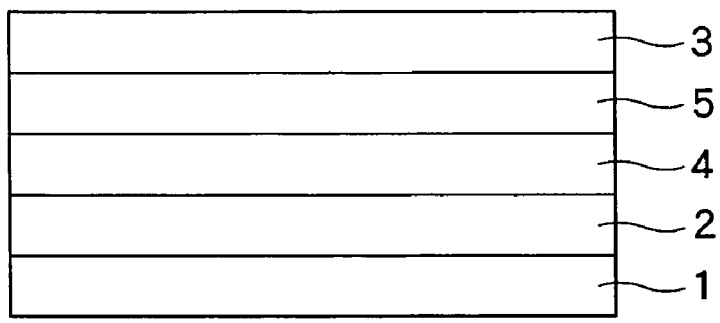
F I G. 1
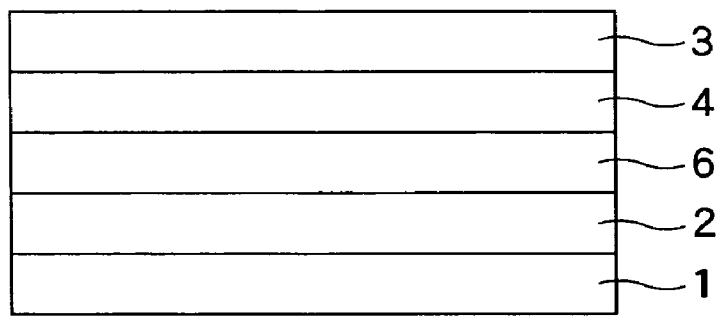
F I G. 2
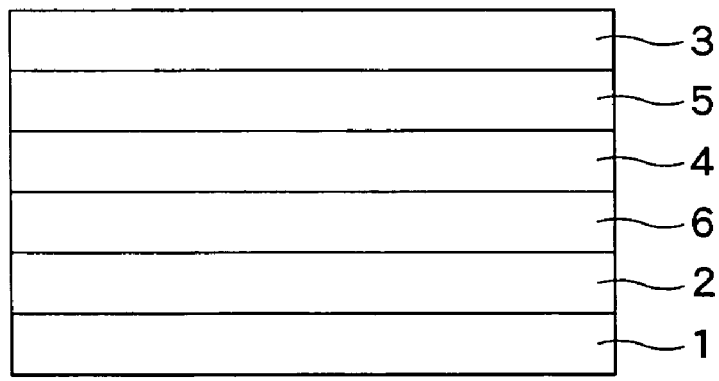
F I G. 3

ORGANIC ELECTROLUMINESCENT ELEMENT AND DISPLAY PANEL USING SAID ELEMENT

This application claims the benefit of Japanese Application 2003-381737, filed Nov. 11, 2003, the entirety of which is incorporated herein by reference.

BACKGROUND OF THE INVENTION

1. Field of the Invention

The present invention relates to an organic electroluminescent ("electroluminescent" being hereinafter abbreviated to "EL") element and a display panel using the organic EL element.

2. Background Art

EL elements utilizing electroluminescence are thin self-luminous elements which have excellent features such as high visibility and a wide view angle. Further, these luminescent elements are completely solid and thus also have excellent impact strength and other properties. Therefore, attention has been drawn to the utilization of this EL element as luminescent elements in various display devices.

EL elements are classified into inorganic EL elements using an inorganic compound as the luminescent material and organic EL elements using an organic compound as the luminescent material. Among them, organic EL elements can particularly significantly reduce applied voltage and can be easily reduced in size. Therefore, power consumption is small. Further, for organic EL elements, surface emission is possible, and luminescence of the three primary colors is also possible. By virtue of these advantages, for the organic EL elements, research and development have been made on the utilization of the organic EL elements as advanced luminescent elements (C. W. Tang and S. A. Van Slyk, Applied Physics Letters, vol. 51, P. 913 (1987)).

In the organic EL elements, a known construction is as follows. Specifically, the construction is basically anode/organic luminescent layer/cathode, and a hole injection transport layer or an electron injection layer is properly added to the above basic construction: for example, a construction of anode/hole injection transport layer/organic luminescent layer/cathode, or a construction of anode/hole injection transport layer/organic luminescent layer/electron injection layer/cathode. The term "charge transport" as used herein is used as meaning the highest concept of electron transport and hole transport. In these constructions, charge transport materials are important for the formation of a charge transport layer and a hole transport layer. The symbol "/" in the above terms means that the electrode or layer before "/" and the electrode or layer after "/" are stacked on top of each other.

The conventional organic EL element utilizes luminescence which is taken out from a fluorescent material. The organic EL element takes out energy, in an excited state produced by recombination of electron injected into the element with hole, as luminescence. The excited state produced as a result of a recombination of electron with hole is considered to be constituted by 25% of a singlet state and 75% of a triplet state.

In an organic EL element utilizing fluorescence, since only energy in a singlet state is used, in principle, the internal quantum efficiency is as low as 25%. In recent years, organic EL elements utilizing phosphorescence have attracted attention. In phosphorescent organic EL elements, not only energy in a singlet state but also energy in a triplet state can be utilized. Therefore, in principle, the internal quantum efficiency can be increased to 100%. In phosphorescent organic EL elements, phosphorescent luminescence can be taken out by doping a metal complex-type luminescent material containing a heavy metal such as platinum or iridium as a dopant which emits phosphorescence into a host material (M. A. Baldo et al., Nature, vol. 395, p. 151 (1998), M. A. Baldo et al., Applied Physics Letters, vol. 75, p. 4 (1999), and M. A, Baldo et al., Nature, vol. 403, p. 750 (2000)).

Luminescence of this phosphorescent dopant depends upon the host material. Basic properties required of the host material include that the host material has a hole transport capability and an electron transport capability, that the reduction potential of the host material is higher than that of the phosphorescent dopant, and that the level of energy in the triplet state of the host material is lower than the reduction potential of the dopant. In general, CBP (4,4'-bis(carbazol-9-yl)-biphenyl is suitably used as the host material (for example, Japanese Patent Laid-Open No. 68466/2003). The use of CBP in the organic EL element is known (for example, Japanese Patent Laid-Open No. 168443/1998).

In this organic EL element utilizing a phosphorescing material, however, a charge transport material such as CBP used as the host material is likely to be crystallized. Therefore, a large amount of doping (about 5 to 10% by mass) is necessary for preventing the crystallization. Further, film formation by coating is disadvantageously difficult. This has made it difficult to provide an organic EL element with a high luminescence efficiency using this CBP by the coating method.

SUMMARY OF THE INVENTION

Accordingly, an object of the present invention is to provide an organic EL element, which can realize the provision of a large screen by the formation of a film through coating in a simple and highly efficient manner, and a display panel using the same.

The present inventors have found that, when a polymer prepared by polymerizing a monomer prepared by introducing a polymerizable double bond through, for example, an alkylene group optionally containing —COO—, —O—, or an arylene group into a carbazole moiety in conventional CBP used as a charge transport material is used as a host material, an organic EL element, which can realize the provision of a large screen by the formation of a film through coating in a simple and highly efficient manner, can be obtained. The present invention has been made based on such finding.

Thus, according to the present invention, there is provided an organic electroluminescent element comprising: a pair of opposed electrodes, a cathode and an anode; and an organic compound layer having a single-layer or multi-layer structure held between said pair of opposed electrodes, at least one layer constituting said organic compound layer being a layer containing at least one polymer comprising at least one monomer unit represented by formula (I):

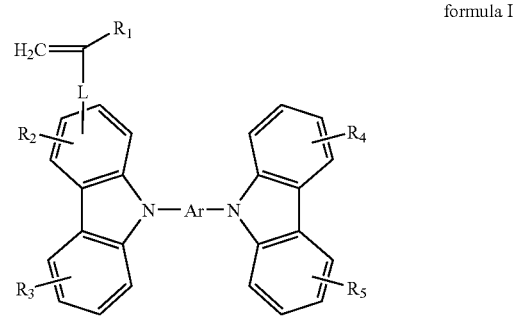

formula I wherein

Ar represents an unsubstituted or substituted arylene group having 6 to 60 carbon atoms involved in conjugation or an unsubstituted or substituted heterocyclic compound group having 4 to 60 carbon atoms involved in conjugation;

L represents a divalent hydrocarbon or hetero-atom-containing hydrocarbon group which may be branched or contain a cyclic structure; and $R_1$ to $R_5$ each independently represent a group selected from the group consisting of a hydrogen atom, an alkyl group having 1 to 20 carbon atoms, an alkoxy group having 1 to 20 carbon atoms, an aryl group having 6 to 60 carbon atoms, an aryloxy group having 6 to 60 carbon atoms, an arylalkyl group having 7 to 60 carbon atoms, an arylalkoxy group having 7 to 60 carbon atoms, a heterocyclic compound group having 4 to 60 carbon atoms, a cyano group, a nitro group, and a halogen atom.

According to another aspect of the present invention, there is provided a display panel comprising the above organic electroluminescent element.

According to the present invention, the use of a polymer comprising at least one monomer unit represented by formula (I) can easily realize an organic EL element with a higher efficiency than the use of the conventional CBP. Further, since the organic EL element according to the present invention can be prepared by film formation using coating, the element can be made so as to have a display region having a large area.

BRIEF DESCRIPTION OF THE DRAWINGS

FIG. 1 is a cross-sectional view of an organic EL element in an embodiment of the present invention;

FIG. 2 is a cross-sectional view of an organic EL element in another embodiment of the present invention;

FIG. 3 is a cross-sectional view of an organic EL element in a further embodiment of the present invention;

DETAILED DESCRIPTION OF THE INVENTION

Figure 4:
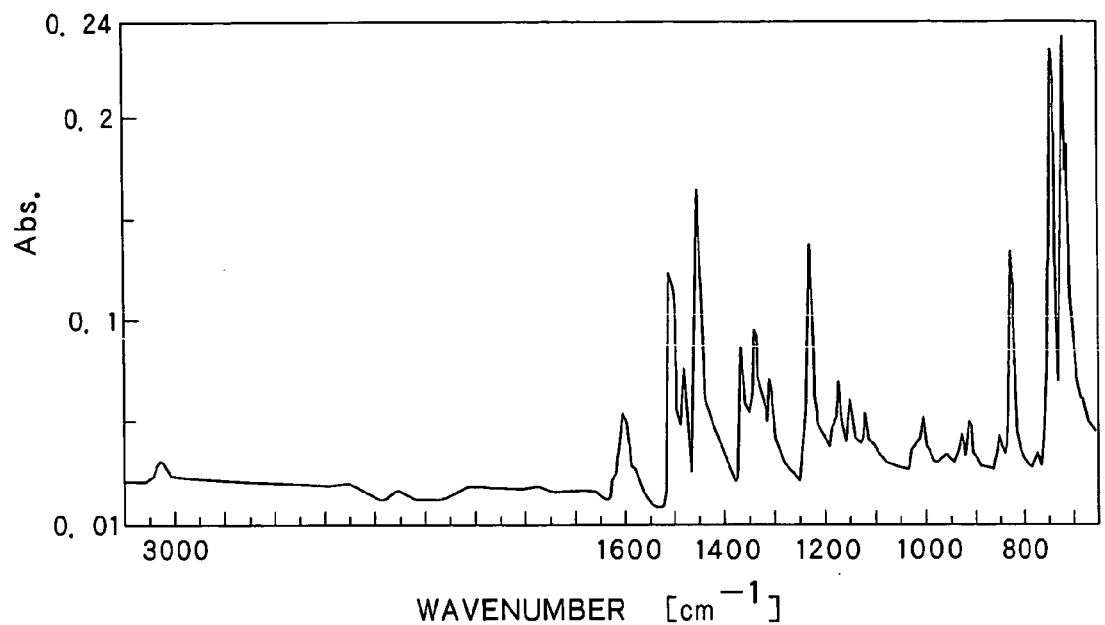
FIG. 4 is an infrared (IR) spectrum of CBP as a comparative reference material.

The present invention will be described in more detail. Formula (I) will be first described.

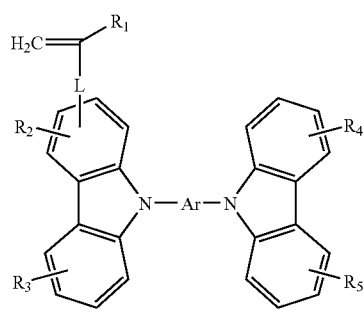

formula I

In formula (I), Ar represents an arylene group having 6 to 60 carbon atoms involved in conjugation or a heterocyclic compound group having 4 to 60 carbon atoms involved in conjugation. Specifically, examples of Ar include aromatic compound groups represented by formulae (a) to (g) or derivative groups thereof.

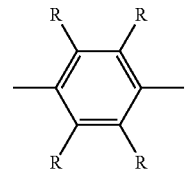
(a)

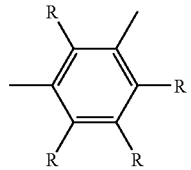
(b)

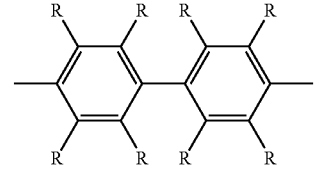
(c)

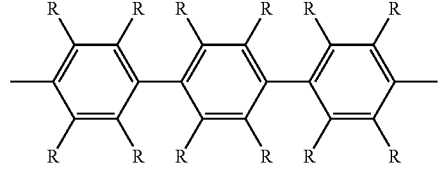
(d)

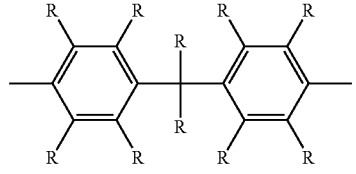
(e)

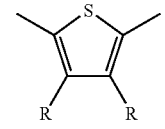
(f)

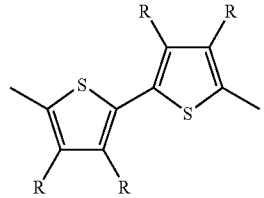
(g)

These arylene and heterocyclic compound groups may be unsubstituted or substituted. Among them, when a heterocyclic or hetero-atom-containing aromatic group is used, the reduction potential or triplet state energy level is likely to be lower than the energy level of phosphorescence dopant. For this reason, there is a possibility that the heterocyclic or hetero-atom-containing aromatic group lacks in compatibility with the phosphorescence dopant. Therefore, among them, specific examples of preferred Ar include the above-described formulae (a) to (e). More preferred are a 1,4-phenylene group of formula (a), a 4,4''-biphenylene group of formula (c), or a 4,4'-terphenylene group of formula (d), and a derivative group of any of these groups. The derivative group is preferably, for example, a derivative group formed by substituting the above group by an alkyl group or a derivative group formed by substituting the above group by an alkoxy group because these groups do not have any significant influence on the energy level.

R in formulae (a) to (g) and $R_1$ to $R_5$ in formula (I), which may be the same or different, represent a group selected from the group consisting of a hydrogen atom, an alkyl group having 1 to 20 carbon atoms, an alkoxy group having 1 to 20 carbon atoms, an aryl group having 6 to 60 carbon atoms, an aryloxy group having 6 to 60 carbon atoms, an arylalkyl group having 7 to 60 carbon atoms, an arylalkoxy group having 7 to 60 carbon atoms, a heterocylic compound group having 4 to 60 carbon atoms, a cyano group, a nitro group, and a halogen atom.

Alkyl groups having 1 to 20 carbon atoms include methyl, ethyl, n-propyl, i-propyl, n-butyl, i-butyl, sec-butyl, t-butyl, n-hexyl, n-octyl, nonyl, decyl, and lauryl groups. Among them, pentyl, hexyl, octyl, and decyl groups are preferred, because they have no significant influence on the energy level of a polymer comprising monomer unit represented by formula (I) (hereinafter referred to as "polymer according to the present invention"), and, in addition, the solubility of the polymer according to the present invention in an organic solvent can be easily ensured.

Alkoxy groups having 1 to 20 carbon atoms include methoxy, ethoxy, propyloxy, butoxy, pentyloxy, hexyloxy, heptyloxy, octyloxy, nonyloxy, decyloxy, and lauryloxy groups. Among them, pentyloxy, hexyloxy, octyloxy, and decyloxy groups are preferred, because they have no significant influence on the energy level of the polymer according to the present invention, and, in addition, the solubility of the polymer according to the present invention in an organic solvent can be easily ensured.

Aryl groups having 6 to 60 carbon atoms include phenyl, $C_1$-$C_{12}$ alkoxyphenyl (wherein $C_1$-$C_{12}$ means that the number of carbon atoms is 1 to 12; the same shall apply hereinafter), $C_1$-$C_{12}$ alkylphenyl, 1-naphthyl, and 2-naphthyl groups. Among them, $C_1$-$C_{12}$ alkoxyphenyl and $C_1$-$C_{12}$ alkylphenyl groups are preferred, because they have no significant influence on the energy level of the polymer according to the present invention, and, in addition, the solubility of the polymer according to the present invention in an organic solvent can be easily ensured.

Aryloxy groups having 6 to 60 carbon atoms include phenoxy, $C_1$-$C_{12}$ alkoxyphenoxy, $C_1$-$C_{12}$ alkylphenoxy, 1-naphthyloxy, and 2-naphthyloxy groups. Among them, $C_1$-$C_{12}$ alkoxyphenoxy and $C_1$-$C_{12}$ alkylphenoxy groups are preferred, because they have no significant influence on the energy level of the polymer according to the present invention, and, in addition, the solubility of the polymer according to the present invention in an organic solvent can be easily ensured.

Arylalkyl groups having 7 to 60 carbon atoms include phenyl-$C_1$-$C_{12}$ alkyl, $C_1$-$C_{12}$ alkoxyphenyl-$C_1$-$C_{12}$ alkyl, $C_1$-$C_{12}$ alkylphenyl-$C_1$-$C_{12}$ alkyl, 1-naphthyl-$C_1$-$C_{12}$ alkyl, and 2-naphthyl-$C_1$-$C_{12}$ alkyl groups. Among them, $C_1$-$C_{12}$ alkoxyphenyl-$C_1$-$C_{12}$ alkyl and $C_1$-$C_{12}$ alkylphenyl-$C_1$-$C_{12}$ alkyl groups are preferred, because they have no significant influence on the energy level of the polymer according to the present invention, and, in addition, the solubility of the polymer according to the present invention in an organic solvent can be easily ensured.

Arylalkoxy groups having 7 to 60 carbon atoms include phenyl $C_1$-$C_{12}$ alkoxy, $C_1$-$C_{12}$ alkoxyphenyl-$C_1$-$C_{12}$ alkoxy, $C_1$-$C_{12}$ alkylphenyl-$C_1$-$C_{12}$ alkoxy, 1-naphthyl-$C_1$-$C_{12}$ alkoxy, and 2-naphthyl-$C_1$-$C_{12}$ alkoxy groups. Among them, the $C_1$-$C_{12}$ alkylphenyl-$C_1$-$C_{12}$ alkoxy group is preferred, because it has no significant influence on the energy level of the polymer according to the present invention, and, in addition, the solubility of the polymer according to the present invention in an organic solvent can be easily ensured.

Heterocyclic compound groups having 4 to 60 carbon atoms include thienyl, $C_1$-$C_{12}$ alkylthienyl, pyrrolyl, furyl, pyridyl, and $C_1$-$C_{12}$ alkylpyridyl groups. Among them, $C_1$-$C_{12}$ alkylthienyl and $C_1$-$C_{12}$ alkylpyridyl groups are preferred, because they have no significant influence on the energy level of the polymer according to the present invention, and, in addition, the solubility of the polymer according to the present invention in an organic solvent can be easily ensured.

Halogen atoms include fluorine, chlorine, bromine, and iodine atoms.

Among the examples of R, alkyl-containing substituents may be straight chain, branched chain, or cyclic substituents or a combination of these substituents. Alkyl-containing substituents, which are not straight chain, include, for example, isoamyl, 2-ethylhexyl, 3,7-dimethyloctyl, cyclohexyl, and 4-$C_1$-$C_{12}$ alkylcyclohexyl groups.

Further, at least one of R in formulae (a) to (g) and $R_1$ to $R_5$ in formula (I) may or may not combine together to form a saturated or unsaturated five- or six-membered ring. Specific examples of the case where the saturated or unsaturated six-membered ring is formed are as follows.

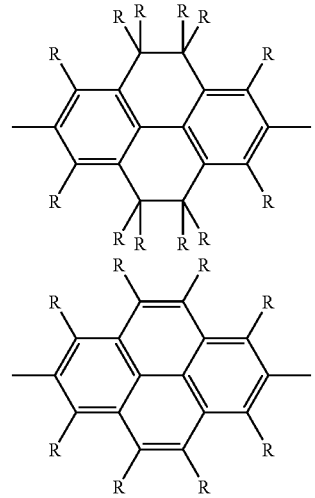

In order that the polymer according to the present invention is soluble in an organic solvent, the polymer preferably contains a plurality of R substituents. Among the above group of substituents, the alkyl or alkoxy group is particularly preferably contained in the polymer. In formula (I), L represents a divalent hydrocarbon group or hetero-atom-containing hydrocarbon group which may be branched or may have a cyclic structure. Preferably, for example, from the viewpoint of ensuring film forming properties, mechanical strength, and charge transport capability, these hydrocarbon groups contain a linking group selected from a straight-chain alkyl bond, an ether bond, an ester bond, a carbonate bond and the like and have 20 or less carbon atoms. Specific examples of L are as follows.

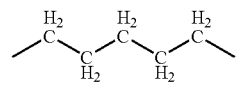

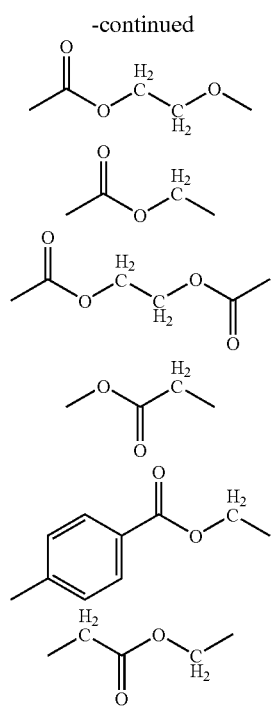

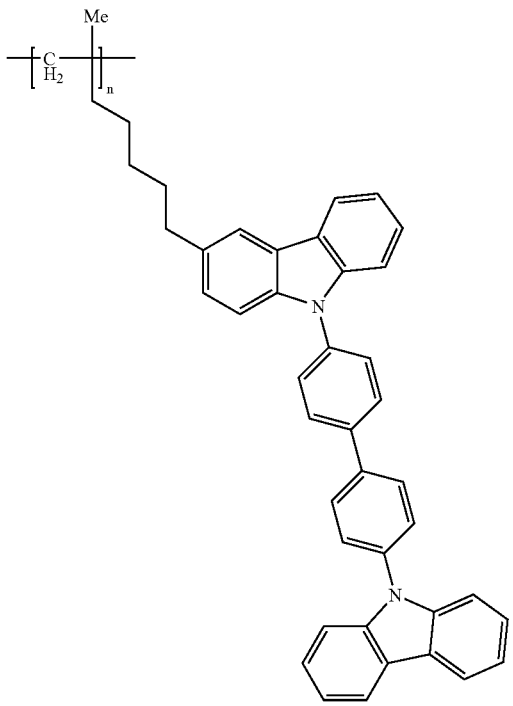

The glass transition temperature, the degree of crystallization, the refractive index, adhesion, solubility and the like can be regulated while maintaining the charge transport capability of the polymer of the present invention by changing the constituent of L in formula (I). A highly functional organic EL element can be realized by regulating these various functions.

The monomer constituting the polymer according to the present invention can be synthesized by a conventional method, for example, by the following process.

A compound represented by formula (II) is first synthesized:

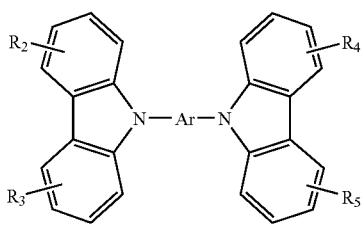

formula II wherein Ar and $R_2$ to $R_5$ are as defined above. This compound may be synthesized by a conventional method (for example, Japanese Patent Laid-Open No. 68466/2003). Next, a functional group, for example, an amino group, a hydroxyl group, a hydroxyalkyl group such as a methylol group, a carboxyl group, a sulfonyl group, an epoxy group, or an isocyanate group, is introduced into the above compound. Next, a monomer represented by formula (I) is prepared by introducing a vinyl compound having a group reactive with the above functional group into the above compound. Vinyl-containing compounds include, for example, (meth)acrylic acid, (meth)acrylamide, (meth)acrylic acid chloride, (meth)acrylic acid anhydride, hydroxyalkyl (meth)acrylate, and glycidyl ether (meth)acrylate. This production process is merely one example of possible production processes, and the monomer may be synthesized by other production process.

Specific examples of polymers, according to the present invention, prepared from the above monomer include polymers represented by the following formulae.

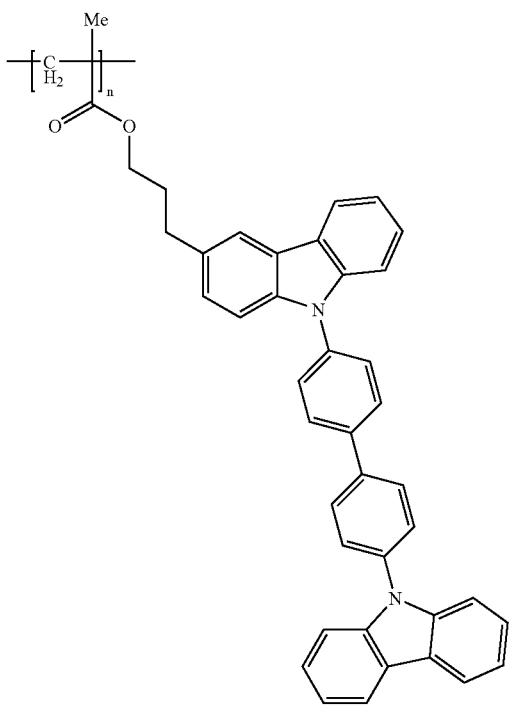

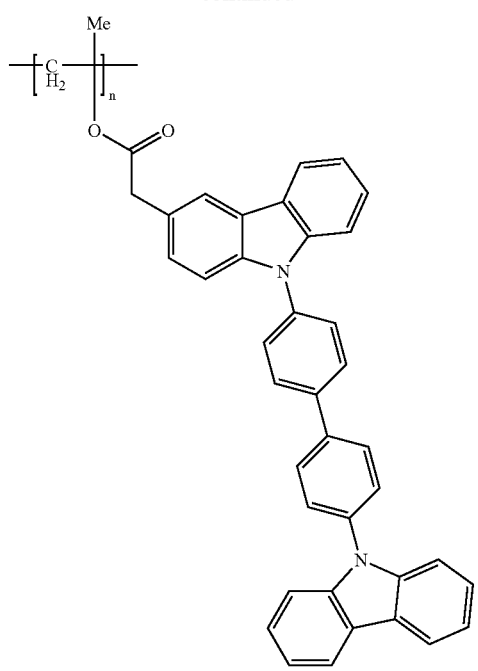
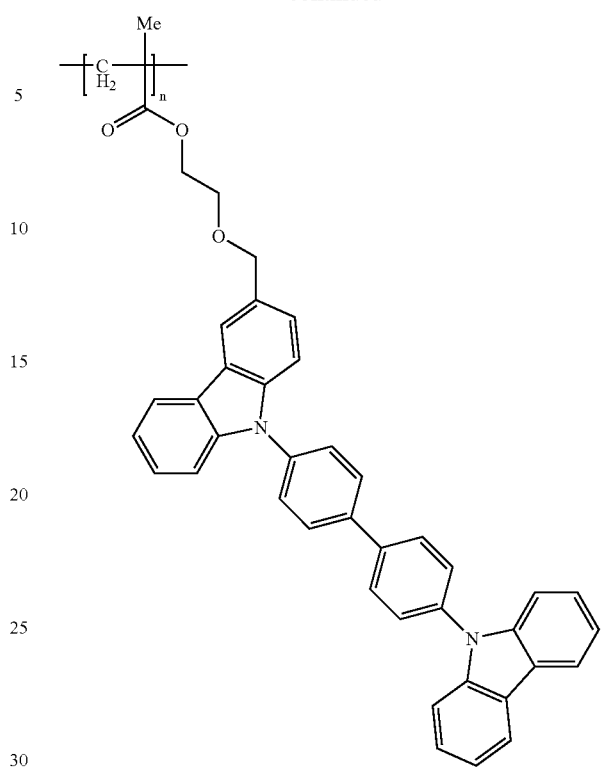
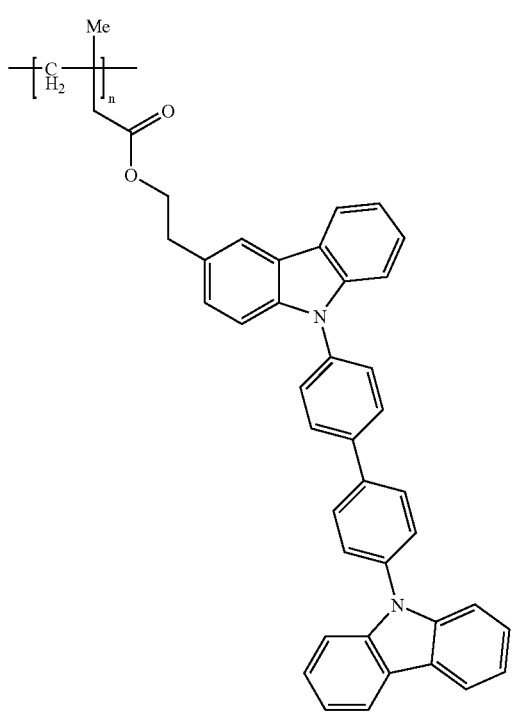
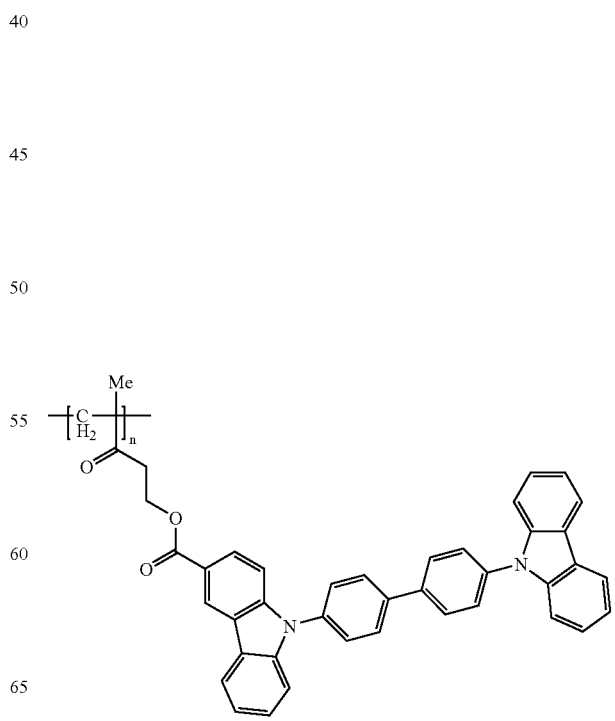

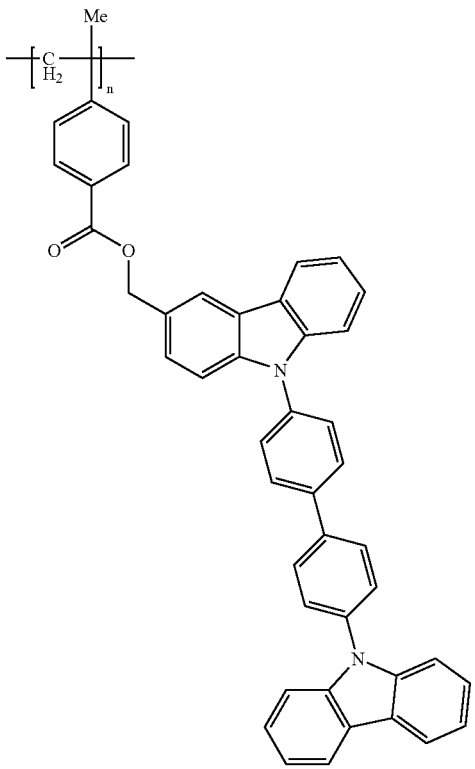

wherein n is an integer of 2 or more.

The polymer according to the present invention is a polymer comprising at least one monomer unit, represented by formula (I), per molecule, preferably a polymer comprising 5 to 100,000 monomer units per molecule. The polymer according to the present invention may be a homopolymer of the above monomer, or alternatively may be a copolymer of the above monomer with other monomer. In the case of the copolymer, the form of the copolymer may be alternate, random, block, or graft. Alternatively, the copolymer may be a polymer having a structure intermediate between these structures, for example, a random copolymer having a structure which is somewhat similar to the block copolymer.

Other monomers copolymerized with the above monomer are not particularly limited. Preferably, however, these other monomers have a structure which does not lower the solubility of the resultant polymer in organic solvents and has a charge transport capability.

A specific example of preferred copolymers is a copolymer with a styrenic monomer, and the use of this copolymer can improve the solubility in organic solvents. Specifically, copolymers represented by the following formula may be mentioned as such copolymers.

wherein n and m each are an integer of 1 or more.

Additional examples of such copolymers include copolymers with a monomer having a triphenylamine structure with a hole transport function represented by the following formula.

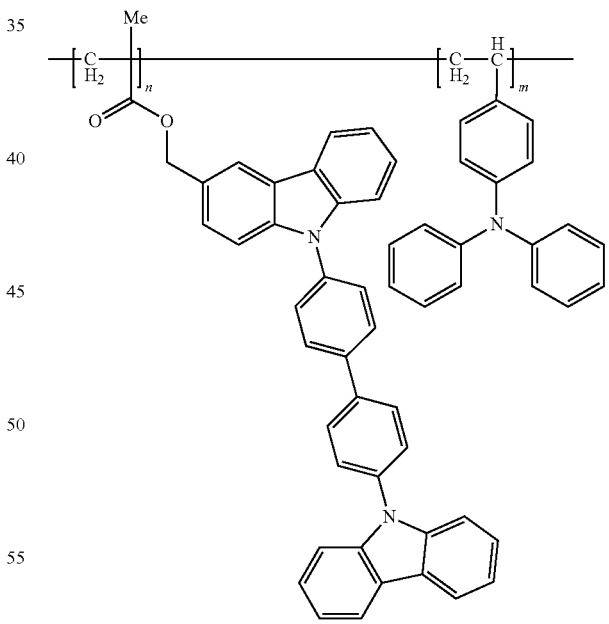

wherein n and m each are an integer of 1 or more.

Further, the polymer according to the present invention may be a copolymer of the monomer represented by formula (I) with a monomer having a structure with a luminescent capability. Iridium-containing metal complexes may be mentioned as the monomer having a structure with a luminescent capability. Specific examples thereof include polymers represented by the following formula.

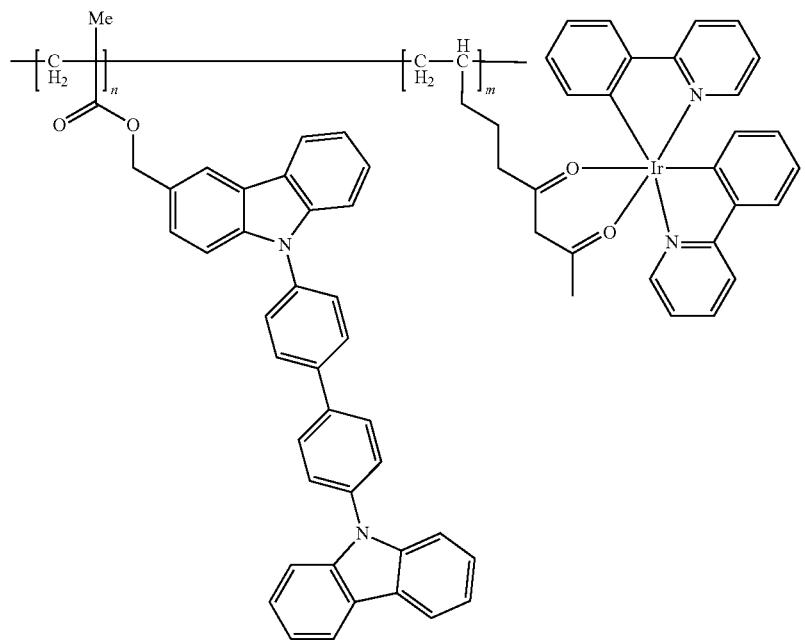

wherein n and m each are an integer of 1 or more.

The content of the monomer unit constituting the polymer according to the present invention is preferably 50 to 100% by mole, more preferably 70 to 100% by mole, based on 100% by mole of the total amount of all the monomer units. When the content of the monomer unit is less than 50% by mole, the content of the monomer unit as the charge transport unit is so low that the charge transport capability of the polymer cannot be maintained.

The degree of polymerization of the polymer according to the present invention depends upon the structure and content of the monomer. Preferably, however, the degree of polymerization of the polymer is $10^3$ to $10^8$ as determined using polystyrene as a standard. More preferably, the degree of polymerization is $10^4$ to $10^6$ from the viewpoints of solubility in solvents and film forming properties. The molecular weight refers to the number average molecular weight determined by gel permeation chromatography (GPC) (solvent: chloroform) using polystyrene as a standard.

The monomer represented by formula (I) may be polymerized or copolymerized with other monomer by any polymerization method without particular limitation. For example, radical polymerization, ion polymerization, and coordination polymerization may be used. Among them, radical polymerization is preferred. Initiators for the radical polymerization include, for example, azo compounds and peroxides. Specifically, azobisisobutyronitrile, azobisisobutyric acid diester derivatives or benzoyl peroxide are suitable.

Any solvent can be used in the polymerization without particular limitation, and examples thereof include aromatic hydrocarbons (for example, benzene and toluene), halogenated hydrocarbons (for example, dichloroethane and chloroform), ethers (for example, tetrahydrofuran and dioxane), amides (for example, diethylformamide and dimethylacetamide), esters (for example, ethyl acetate), alcohols (for example, methanol), and ketones (for example, acetone and cyclohexanone). Solution polymerization in which polymerization is carried out in a homogeneous system and precipitation polymerization in which the resultant polymer is precipitated may also be utilized by selecting a proper solvent.

The organic EL element according to the present invention comprises a pair of opposed electrodes and an organic compound layer having a single-layer or multi-layer structure held between these electrodes. At least one layer constituting the organic compound layer is a layer containing at least one polymer according to the present invention. The other construction is not particularly limited, and any conventional structure may be adopted.

Examples of structures which may be adopted in the present invention include a structure in which a pair of electrodes are provided on both sides of a luminescent layer formed of a mixture of the polymer according to the present invention with a luminescent material, a structure in which an electron transport layer containing an electron transport material is provided between a cathode and a luminescent layer, and/or a structure in which a hole transport material-containing hole transport layer is provided between an anode and a luminescent layer. Further, a layer formed of the polymer according to the present invention may be stacked as a charge transport layer on a luminescent layer formed of other luminescent material. Further, the luminescent layer and the charge transport layer may have a single-layer structure or a multi-layer structure of a combination of a plurality of layers.

When the layer containing at least one polymer according to the present invention is used as the luminescent layer, the luminescent layer may be formed of a dispersion of at least one luminescent material in the polymer. Luminescent materials usable herein may be conventional luminescent materials which will be described later. Alternatively, the luminescent layer may be formed of a dispersion of the polymer in other polymeric compound.

The polymer according to the present invention and other charge transport material can be simultaneously used. Other charge transport materials, that is, electron transport materials or hole transport materials, are not particularly limited and may be conventional ones. Hole transport materials include, for example, pyrazoline derivatives, arylamine derivatives, stilbene derivatives, and triphenyldiamine derivatives. Electron transport materials include, for example, oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, and metal complexes of 8-hydroxyquinoline or its derivatives. They may be used either solely or as a mixture of two or more of them. Any one of the electron transport compound and the hole transport compound may be used, or alternatively both the electron transport compound and the hole transport compound may be simultaneously used.

Next, a representative preparation method of an organic EL element according to the present invention will be described. In order to provide a planar luminescent organic EL element, at least one of the pair of electrodes of an anode and a cathode should be transparent or semitransparent. In the case of a structure in which luminescence is taken out from the end face of the organic EL element, the electrode is not necessarily required to be transparent or semitransparent.

Materials for the substrate used in the organic EL element include quartz, glass plates such as soda glass plates, metallic plates or foils, and plastics such as acrylic resins, styrene resins, and polycarbonate resins. In the organic EL element, when luminescence is taken out from the substrate side, preferably, the substrate and the electrode provided on the substrate are transparent or semitransparent.

For example, electrically conductive metal oxide films or thin metal films are used in the electrode. Specifically, materials for the electrode include: electrically conductive metal oxides such as tin oxide, zinc oxide, indium oxide, and indium tin oxide (ITO); metals such as gold, silver, chromium, and nickel; organic electrically conductive materials such as polyaniline, polythiophene, and polypyrrole; and mixtures and laminates of the above materials. In particular, ITO is preferred as the anode, for example, from the viewpoint of high electrical conductivity and transparency.

Next, a layer comprising the polymer according to the present invention and a luminescent material is preferably provided as a luminescent layer on the electrode. The luminescence color of the organic EL element can be easily varied by varying the luminescent material. Luminescent materials include, for example, organic metal complexes such as aluminum-quinoline complex, derivatives thereof, $\pi$ conjugated polymer materials typified by polyparaphenylenevinylene, naphthalene derivatives, anthracene or its derivatives, perylene or its derivatives, dyes such as polymethine dyes, xanthene dyes, coumarine dyes, and cyanine dyes, aromatic amines, tetraphenylcyclopentadiene or its derivatives, or tetraphenylbutadiene or its derivatives. The content of the luminescent material is preferably about 0.1 to 20 parts by mass based on 100 parts by mass of the polymer according to the present invention. When the content of the luminescent material is less than 0.1 part by mass, satisfactory luminescence brightness cannot be provided. On the other hand, when the content of the luminescent material exceeds 20 parts by mass, interaction occurs between luminescent materials. As a result, concentration quenching which lowers efficiency occurs, or otherwise the service life of the element is likely to be lowered.

In the present invention, the use of a phosphorescent iridium compound as the luminescent material is particularly preferred. When the phosphorescent iridium compound is used, energy in a triplet state can also be utilized and, consequently, an organic EL element with a high efficiency can be realized.

Phosphorescent iridium compounds include, for example, complex compounds of iridium with nitrogen atom-containing aromatic compounds such as phenylpyridine, phenylpyrimidine, bipyridyl, 1-phenylpyrazole, 2-phenylquinoline, 2-phenylbenzothiazole, 2-phenyl-2-oxazoline, 2,4-diphenyl-1,3,4-oxadiazole, 5-phenyl-2-(4-piridyl)-1,3-oxadiazole, 2-(2-pyridyl-thiophen)-2-phenyl-4H-3,1-benzoxazine-4, or their derivatives. The content of the phosphorescent iridium compound is preferably about 0.5 to 20 parts by mass based on 100 parts by mass of the polymer. When the content of the phosphorescent iridium compound is less than 0.5 part by mass, satisfactory luminescence brightness cannot be provided. On the other hand, when the content of the phosphorescent iridium compound exceeds 20 parts by mass, interaction between luminescent materials occurs. As a result, concentration quenching which causes a lowering in efficiency occurs, or otherwise the service life of the element is likely to be lowered.

Methods for luminescent layer formation include coating methods such as spin coating, cast coating, dip coating, die coating, bead coating, bar coating, roll coating, spray coating, gravure coating, flexo printing, screen printing, and offset printing. In this case, a melt, a solution, a dispersion, or a mixed liquid of a luminescent material can be coated to from a luminescent layer.

The thickness of the luminescent layer is 1 nm to 1 µm, preferably 2 to 500 nm, more preferably 5 to 500 nm. When the luminescent layer is formed by the coating method, preferably, heat drying at 30 to 300° C., preferably 60 to 200° C., under reduced pressure or in an inert atmosphere is carried out to remove the solvent. When the luminescent layer and the other charge transport material are stacked on top of each other, preferably, a hole transport layer is formed on the anode before the luminescent layer is provided by the above coating method, or alternatively an electron transport layer is formed after the formation of the luminescent layer.

The charge transport layer may be formed by any method without particular limitation. Examples of methods usable for charge transport layer formation include vacuum deposition using a solid and coating methods using a melt, a solution, a dispersion or a mixed liquid, for example, spin coating, cast coating, dip coating, die coating, bead coating, bar coating, roll coating, spray coating, gravure coating, flexo printing, screen printing, and offset printing. The thickness of the charge transport layer is 1 nm to 1 µm, preferably 2 to 500 nm, more preferably 5 to 200 nm.

Next, an electrode (cathode) is provided on the luminescent layer or the charge transport layer. The cathode is preferably formed of a material having a work function of less than 4 eV from the viewpoint of easiness in electron injection. Materials usable for the cathode include: alkali metals, for example, lithium, sodium, and cesium, and halides thereof, for example, lithium fluoride, cesium fluoride, lithium chloride, and cesium chloride; alkaline earth metals, for example, calcium and magnesium, and halides thereof, for example, calcium fluoride and magnesium fluoride; metals such as aluminum and silver; electrically conductive metal oxides; and alloys or mixtures of the above materials.

The cathode may be prepared, for example, by vacuum deposition, sputtering, or lamination involving contact bonding of a metallic thin film. After the preparation of the cathode, a protective layer for protecting the organic EL element may be provided on the cathode. The provision of a protective layer or a protective cover on the organic EL element is preferred from the viewpoint of protecting the organic EL element from the external influence to stably use the organic EL element for a long period of time. Materials usable for the protective layer include polymeric compounds, metal oxides, metal fluorides, metal borides, silicon oxide, and silicon nitride. For example, a glass plate or a plastic plate having a surface subjected to water permeability reducing treatment can be suitably used as the protective cover. Preferably, the protective cover is laminated onto the substrate of the element with the aid of a heat-curable resin or photocurable resin followed by hermetical sealing of the element.

FIG. 1 is a cross-sectional view of an organic EL element in an embodiment of the present invention. In the organic EL element according to the present invention, for example, as shown in FIG. 1, an electron injection layer 5 containing an electron transport compound may be provided between the luminescent layer 4 and the cathode 3. Further, as shown in FIG. 2, a hole injection layer 6 containing a hole transport compound may be provided between the luminescent layer 4 and the anode 2. Furthermore, as shown in FIG. 3, a structure may be adopted in which an electron injection layer 5 containing an electron transport compound is provided between the luminescent layer 4 and the cathode 3 and a hole injection layer 6 containing a hole transport compound is provided between the luminescent layer 4 and the anode 2. When this structure is adopted, the electron and/or the hole can be easily injected into the organic EL element and, in addition, the electron and the hole can be injected in a good balance.

In order to provide a planar organic EL element, arrangement may be conducted so that a planar anode and a planar cathode are put on top of each other. Pattern-wise luminescence can be provided on the surface of the luminescent element by disposing a mask with a window pattern, or by forming an organic layer having an extremely thick part to provide a substantially nonluminescent part, or by forming electrodes in such a manner that any one of or both the anode and the cathode are in a pattern form. Methods usable for the preparation of a dot matrix element include a method wherein both the anode and the cathode are formed in a stripe form and are disposed orthogonally to each other and a method wherein one of the electrodes is constructed so as to be selectively driven by TFT. Further, the arrangement of a plurality of organic EL elements different from each other in luminescent color in an identical plane can realize partial color display, multicolor display, and full-color display.

When the above polymer is used, as compared with the use of the conventional CBP, an organic EL element with a higher efficiency can be easily provided. Further, since the organic EL element according to the present invention can be produced by film formation using coating, the element can be constructed so as to have a large-area display region. A thin, high-luminescence efficiency, and high-efficiency display panel can be provided by thermocompression-bonding the organic EL element according to the present invention produced above to a module produced through a modularization process by an anisotropic electrically conductive film (ACF) or the like.

EXAMPLES

The following Examples further illustrate but do not limit the present invention.

Synthesis of Polymer 1 of the Present Invention

Measuring instruments and measuring conditions used for synthesis are as follows.

(1) $^1$H-NMR: DRX-500 apparatus (500 MHz) manufactured by BRUKER, internal reference material=tetramethylsilane, as measured in deutrochloroform (2) IR: Fourier transformation infrared spectrophotometer FT/IR-610 apparatus (manufactured by Japan Spectroscopic Co., Ltd.)

(3) MASS: Hitachi M-80B (manufactured by Hitachi, Ltd.)

(4) Molecular weight: measured by GPC (two columns of Shodex GPC (K806M) being connected to each other); determined using polystyrene as a standard in chloroform solvent A 2-L Kolben equipped with a stirrer and a drain device was charged under a nitrogen stream with 150 g (369.5 mmol) of 4,4'-diiodobiphenyl, 123.5 g (738.6 mmol) of carbazole, 23 g of copper powder, 100 g of potassium carbonate, and 500 ml of 1,3-diisopropylbenzene. The mixture was heated under reflux for 30 hr and was allowed to cool. Toluene was then added, and the mixture was filtered. The solvent in the filtrate was distilled off under reduced pressure. Methanol (500 ml) was added to the residue to precipitate crystals. The crystals were collected by filtration to give CBP (4,4'-bis(carbazol-9-yl)-biphenyl) (122.8 g, yield 68.6%).

A 200-ml Kolben equipped with a stirrer and a condenser was charged under a nitrogen stream with 60 g (123.8 mmol) of CBP prepared above, 337 g (2475 mmol) of N,N-dimethylformamide, and 750 ml of chloroform. The mixture was heated on a warm water bath to 60° C., and 190 g (1239.4 mmol) of phosphorus oxychloride was added dropwise to the above mixture. After the dropwise addition, the mixture was heated with stirring for 8 hr. This reaction solution was poured into an aqueous sodium carbonate solution. The organic layer was washed with water, and the solvent was distilled off. The residue was subjected to fractionation by column chromatography on silica gel (eluent: toluene) to give 4-(carbazol-9-yl)-4'-(3-formylcarbazol-9-yl)-biphenyl (23 g, yield 36.2%).

A 100-ml Kolben equipped with a stirrer and a condenser was charged under a nitrogen stream with 18 g (15.6 mmol) of 4-(carbazol-9-yl)-4'-(3-formylcarbazol-9-yl)-biphenyl prepared above and 800 ml of tetrahydrofuran. Sodium tetrahydroborate (0.65 g, 17.2 mmol) was introduced at room temperature into the above mixture, and the mixture was stirred for one hr. Thereafter, 160 ml of methanol was introduced into the reaction solution, and the mixture was stirred for 3 hr. The solvent was distilled off, and the residue was dissolved in 500 ml of toluene. The solution was washed with water, and the solvent was then distilled off to give 4-(carbazol-9-yl)-4'-(3-hydroxymethylcarbazol-9-yl)-biphenyl (7.9 g, yield 98.4%).

A 100-ml Kolben equipped with a stirrer and a condenser was charged under a nitrogen stream with 7.5 g (14.6 mmol) of 4-(carbazol-9-yl)-4'-(3-hydroxymethylcarbazol-9-yl)-biphenyl, 2.7 g (17.5 mmol) of methacrylic acid anhydride, 500 ml of toluene, 0.2 g of dimethylaminopyridine, and 2.5 g of triethylamine, and the mixture was stirred at room temperature for 20 hr. Methanol (30 ml) was added to the mixture, followed by stirring for one hr. An aqueous dilute sulfuric acid solution was then added thereto. The organic layer was separated and was then washed with water, and the solvent was distilled off. Methanol was added to the residue to precipitate crystals. The crystals were collected by filtration and was purified by column chromatography on silica gel (eluent: toluene) to give monomer A represented by the following formula (8 g, yield 94.0%).

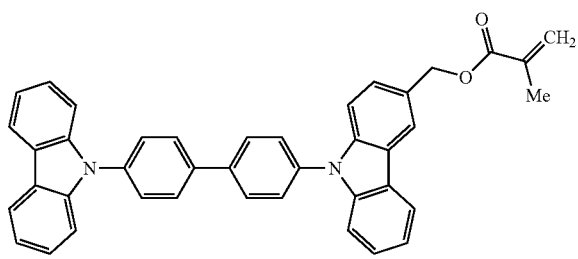

The results of analysis were as follows.

$^1$H NMR: 1.98 (s, 3H), 5.40 (s, 2H), 5.57 (s, 1H), 7.29-7.36 (m, 3H), 7.41-7.54 (m, 8H), 7.67-7.72 (m, 4H), 7.89-7.93 (m, 4H), 8.15-8.23 (m, 4H).

A 200-ml Kolben was charged with 7.5 g (12.8 mmol) of monomer A and 150 ml of toluene under a nitrogen stream. The mixture was heated on a warm water bath to 80° C., and 0.15 g (0.9 mmol) of azobisisobutyronitrile was introduced into the mixture. A polymerization was allowed to react with stirring for 5 hr. After the completion of the reaction, the reaction solution was allowed to cool. This reaction solution was added dropwise to acetone. The resultant precipitate was collected by filtration and was washed with acetone to give 4.5 g of polymer 1 of the present invention represented by the following formula.

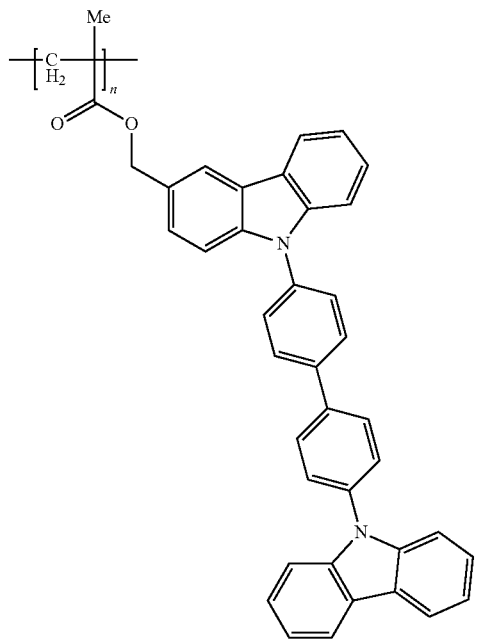

wherein n is a number which provides a molecular weight of 10,000.

Figure 5:
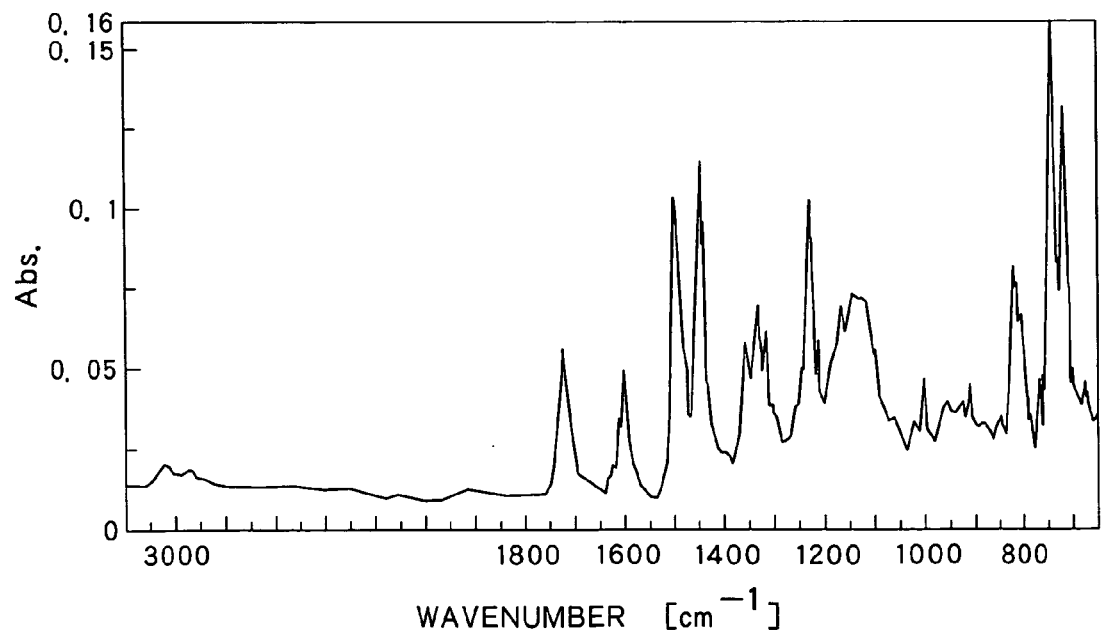
FIG. 5 is an IR spectrum of polymer 1.

An IR spectrum of CBP as a comparative reference material is shown in FIG. 4, and an IR spectrum of the polymer 1 is shown in FIG. 5. The IR spectrum of polymer 1 had the following main absorption peaks.

3,042 cm$^{-1}$: stretching of aromatic C—H (derived from CBP unit); 2,946 cm$^{-1}$: stretching of alkane C—H (derived from polymer main chain); 1,726 cm$^{-1}$: stretching of saturated fatty ester C=O; 1,503 cm$^{-1}$: stretching of n-aromatic C=C (derived from CBP unit); 1,200-1,100 cm$^{-1}$: stretching of saturated fatty ester C—O; 746 cm$^{-1}$: out-of-plane deformation vibration of polycyclic aromatic C—H (derived from CBP unit); and 722 cm$^{-1}$: out-of-plane deformation vibration of polycyclic aromatic C—H (derived from CBP unit).

The number average molecular weight of polymer 1 was about 10,000 as determined using polystyrene as a standard.

Synthesis of Polymer 2 of the Present Invention

A 200-ml Kolben was charged with 3.2 g (5.5 mmol) of monomer A prepared above, 0.5 g (4.8 mmol) of styrene, and 80 ml of toluene under a nitrogen stream. The mixture was heated on a warm water bath to 80° C., and 0.15 g (0.9 mmol) of azobisisobutyronitrile was introduced into the mixture. A polymerization was allowed to react with stirring for 5 hr. After the completion of the reaction, the reaction solution was allowed to cool. This reaction solution was added dropwise to acetone. The resultant precipitate was collected by filtration and was washed with acetone to give 2.0 g of polymer 2 represented by the following formula.

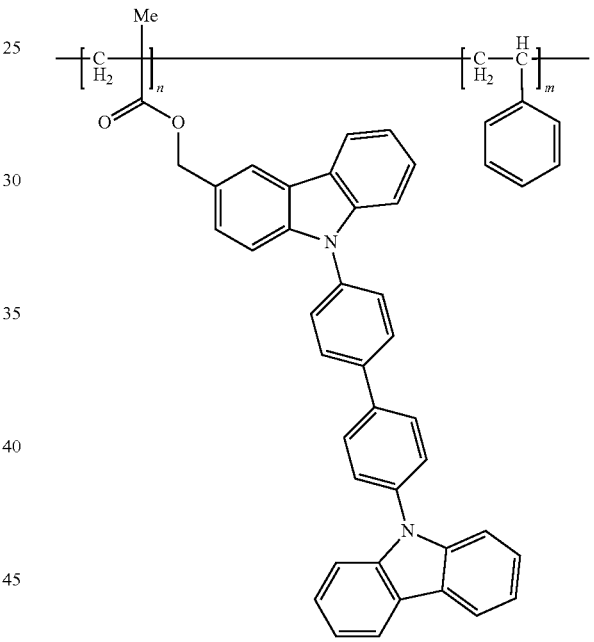

wherein n+m is a number which provides a molecular weight of 7,000.

Figure 6:
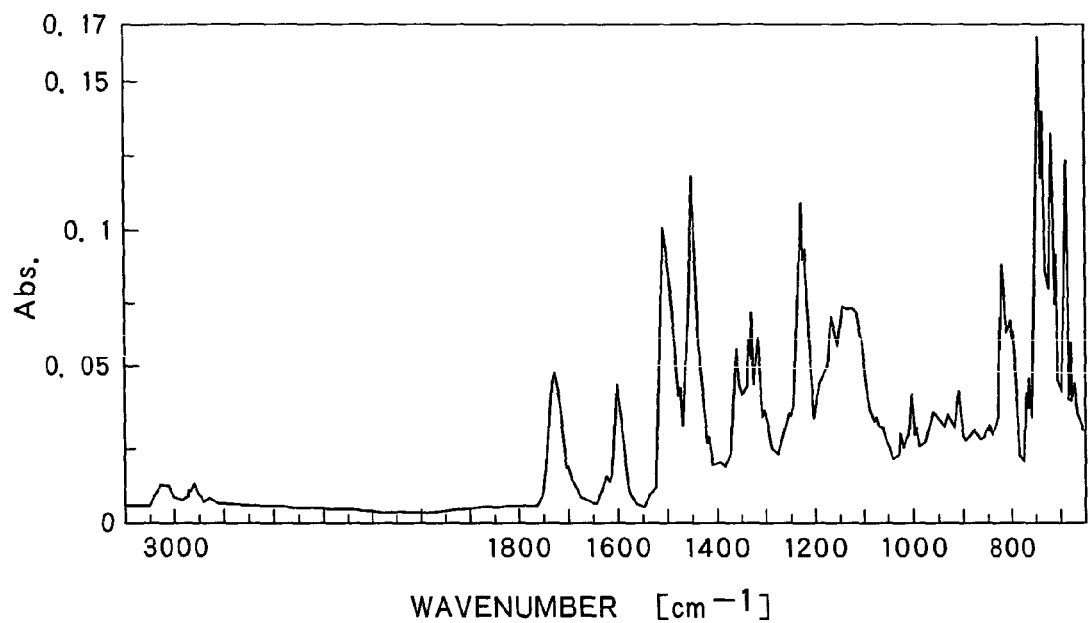
FIG. 6 is an IR spectrum of polymer 2.

An IR spectrum of the polymer 2 is shown in FIG. 6. The IR spectrum of polymer 2 had the following main absorption peaks.

3,100-3,000 cm$^{-1}$: stretching of aromatic C—H (derived from CBP unit, styrene unit); 2,922 cm$^{-1}$: stretching of alkane C—H (derived from polymer main chain); 1,725 cm$^{-1}$: stretching of saturated fatty ester C=O; 1,503 cm$^{-1}$: stretching of aromatic C=C (derived from CBP unit, styrene unit); 1,200-1,100 cm$^{-1}$: stretching of saturated fatty ester C—O; 746 cm$^{-1}$: out-of-plane deformation vibration of polycyclic aromatic C—H (derived from CBP unit); 723 cm$^{-1}$: out-of-plane deformation vibration of polycyclic aromatic C—H (derived from CBP unit); and 699 cm$^{-1}$: out-of-plane deformation vibration of monocyclic aromatic C—H (derived from styrene unit).

The number average molecular weight of polymer 2 was about 7,000 as determined using polystyrene as a standard.

Dissolution Test and Film Formation Test

Polymer 1 was soluble in an amount of not less than 1% by mass in chloroform, 1,2-dichloroethane, and tetrahydrofuran. Polymer 2 was soluble in an amount of not less than 1% by mass in toluene, chloroform, 1,2-dichloroethane, and tetrahydrofuran. Further, polymers 1 and 2, when used with any of the above solvents, could be spin coated on a glass substrate to form an even thin film without doping or any binder.

Measurement of Energy Level

Thin films of polymers 1 and 2 prepared above and a thin film of CBP as a comparative reference material were formed and were measured for their work function and electron affinity. The thin film of CBP was formed by vacuum deposition. The work function was determined with an ultraviolet photoelectron analyzer (AC-1, manufactured by RIKEN KEIKI CO., LTD.) in the air. Next, an absorption spectrum was measured with an ultraviolet-visible absorption spectrum measuring apparatus (MPC-3100, manufactured by Shimadzu Seisakusho Ltd.) to calculate a bandgap value based on the end on the longer wavelength side of the spectrum. The electron affinity was calculated based on the measured work function value and bandgap value.

Polymer 1 had a work function value of 5.89 eV and an electron affinity of 2.60 eV. Polymer 2 had a work function value of 5.91 eV and an electron affinity of 2.61 eV. These work function and electron affinity values were substantially comparable to the work function value (5.58 eV) and the electron affinity (2.23 eV) of CBP. This demonstrates that polymers 1 and 2 can be coated to form a film while maintaining properties comparable to those of CBP.

Example 1

1. Preparation of Organic EL Element 1

A substrate prepared by forming a transparent electrically conductive film of ITO on a glass substrate was patterned into a desired shape, and the patterned substrate was then cleaned and was subjected to UV/ozone treatment. Next, a water dispersion of poly-3,4-ethylenedioxythiophene/polystyrene sulfonate (referred to also as "PEDOT/PSS"; tradename: Baytron TPCH 8000, manufactured by Bayer) was dropped on the treated substrate for spin coating. Thereafter, the coated substrate was heat dried on a hot plate of 200° C. for 15 min to form an 80 nm-thick hole transport layer on the substrate.

Subsequently, polymer 1 was mixed with Ir(ppy)$_3$(tris(2-phenylpyridine)iridium) and tetrahydrofuran in the following composition ratio to prepare a composition for the formation of a layer serving both as an electron transport layer and a luminescent layer (hereinafter often referred to as an electron transport/luminescent layer). This composition was dropped on the hole transport layer for spin coating to form a 76 nm-thick layer serving both as an electron transport layer and a luminescent layer.

| Composition | |
|---|---|
| Polymer 1 | 19 pts. wt. |
| Ir(ppy)$_3$ | 1 pt. wt. |
| Tetrahydrofuran | 1313 pts. wt. |

Further, under a vacuum of $1.3 \times 10^{-6}$ Torr, metallic calcium was vacuum deposited (film thickness: 10 nm) on the electron transport/luminescent layer at a film formation rate of 0.08 nm/sec, and silver was then vacuum deposited (film thickness: 250 nm) thereon at a film formation rate of 0.2 nm/sec to form an electrode. Thus organic EL element 1 was prepared. An external power source (SourceMeter 2400, manufactured by Keithley Instruments, Inc.) was connected to organic EL element 1 thus obtained, and ITO was used as an anode while the metal electrode was used as a cathode. In this state, a dc voltage was applied. Upon the application of the voltage, green luminescence derived from Ir(ppy)$_3$ was observed.

2. Evaluation of Organic EL Element 1

Figure 7:
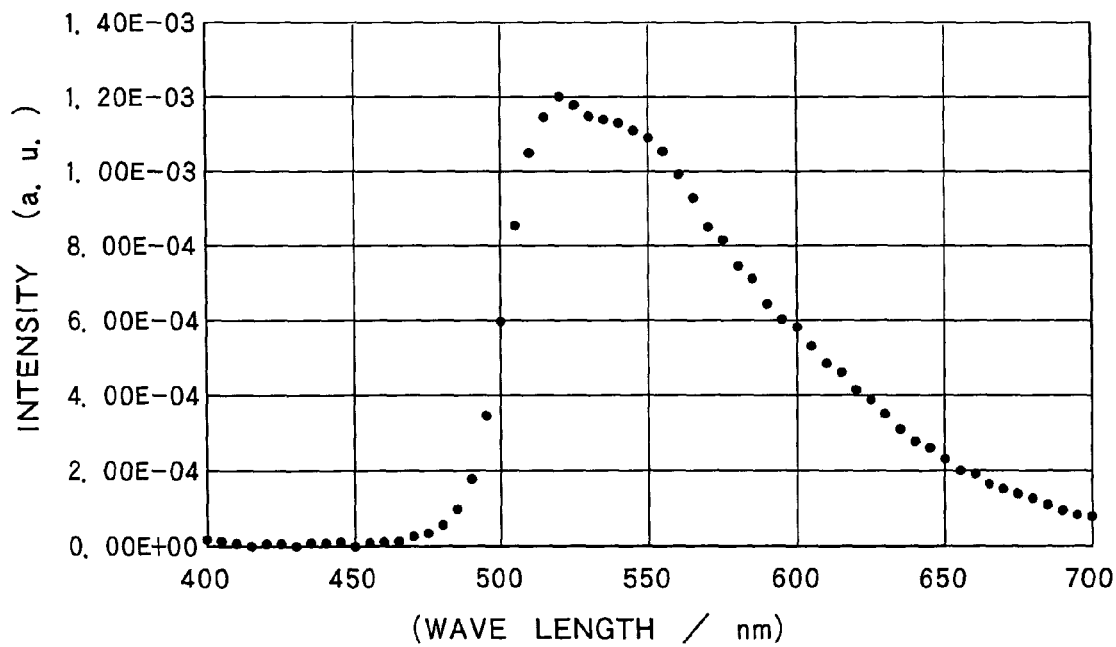
FIG. 7 is a luminescence spectrum of an organic EL element according to the present invention.

The luminescence brightness of the organic EL element thus obtained was measured with a luminance meter (BM-8, manufactured by Topcon Corp.). Further a luminescence spectrum was measured with a spectroradiometer (SR-2, manufactured by Topcon Corp.). The luminescence spectrum is shown in FIG. 7. In this element, when the applied voltage reached 9 V, luminescence began to be observed. When the applied voltage was increased to 20 V, the luminescence brightness was about 100 cd/m$^2$. The maximum luminescence efficiency was about 7.5 cd/A.

Example 2

Preparation and Evaluation of Organic EL Element 2

Organic EL element 2 was prepared in the same manner as in Example 1, except that polymer 2 was used instead of polymer 1 used in Example 1. Organic EL element 2 had the same luminescence characteristics as organic EL element 1. In this element, when the applied voltage reached 8 V, luminescence began to be observed. When the applied voltage was increased to 20 V, the luminescnece brightness was about 1000 cd/m$^2$. The maximum luminescence efficiency was about 10 cd/A.

The invention claimed is:

1. An organic electroluminescent element comprising: a pair of opposed electrodes, a cathode and an anode; and an organic compound layer having a single-layer or multi-layer structure held between said pair of opposed electrodes, at least one layer constituting said organic compound layer being a layer containing at least one copolymer comprising at least one monomer unit represented by formula (I) and at least one other monomer:

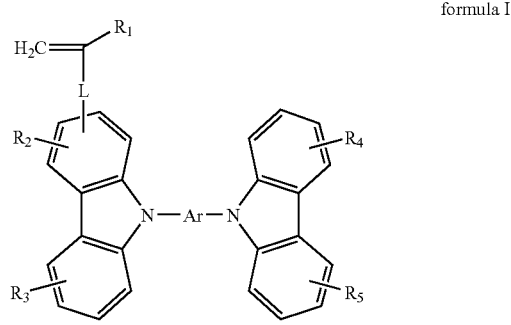

formula I wherein

Ar represents an unsubstituted or substituted arylene group having 6 to 60 carbon atoms involved in conjugation or an unsubstituted or substituted heterocyclic compound group having 4 to 60 carbon atoms involved in conjugation;

L represents a divalent hydrocarbon or hetero-atom-containing hydrocarbon group, which may be branched or contain a cyclic structure, having one or more carbon atoms;

$R_1$ to $R_5$ each independently represent a group selected from the group consisting of a hydrogen atom, an alkyl group having 1 to 20 carbon atoms, an alkoxy group having 1 to 20 carbon atoms, an aryl group having 6 to 60 carbon atoms, an aryloxy group having 6 to 60 carbon atoms, an arylalkyl group having 7 to 60 carbon atoms, an arylalkoxy group having 7 to 60 carbon atoms, a heterocyclic compound group having 4 to 60 carbon atoms, a cyano group, a nitro group, and a halogen atom, and the at least one other monomer is selected from the group consisting of styrene, a monomer having a triphenylamine structure represented by formula (III) and a monomer having an Iridium-containing metal complex structure represented by formula (IV):

Formula III

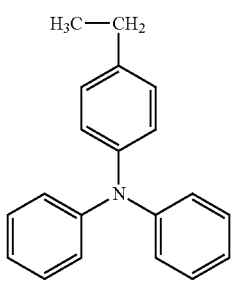

Formula IV

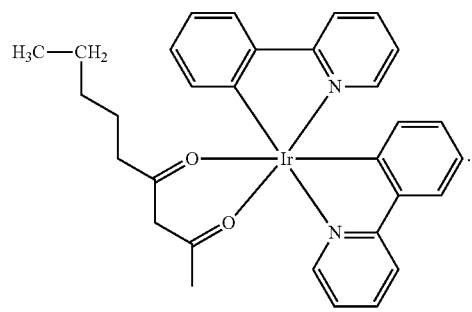

2. The organic electroluminescent element according to claim 1, wherein said layer containing at least one copolymer is a luminescent layer with at least one luminescent material being dispersed therein.

3. The organic electroluminescent element according to claim 2, wherein said luminescent material is a phosphorescent iridium compound.

4. The organic electroluminescent element according to claim 2, wherein a layer containing an electron transport compound is provided between said luminescent layer and said cathode.

5. The organic electroluminescent element according to claim 2, wherein a layer containing a hole transport compound is provided between said luminescent layer and said anode.

6. The organic electroluminescent element according to claim 2, wherein a layer containing an electron transport compound is provided between said luminescent layer and said cathode and, in addition, a layer containing a hole transport compound is provided between said luminescent layer and said anode.

7. A display panel comprising the organic electroluminescent element according to claim 1.

* * * * *